(12) United States Patent
Kobayashi

(10) Patent No.: US 12,286,296 B2
(45) Date of Patent: Apr. 29, 2025

(54) CEILING TRANSPORT VEHICLE

(71) Applicant: Murata Machinery, Ltd., Kyoto (JP)

(72) Inventor: Makoto Kobayashi, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 711 days.

(21) Appl. No.: 17/641,466

(22) PCT Filed: Jul. 31, 2020

(86) PCT No.: PCT/JP2020/029593
§ 371 (c)(1),
(2) Date: Mar. 9, 2022

(87) PCT Pub. No.: WO2021/049203
PCT Pub. Date: Mar. 18, 2021

(65) Prior Publication Data
US 2022/0402694 A1   Dec. 22, 2022

(30) Foreign Application Priority Data

Sep. 13, 2019  (JP) .................................. 2019-167665

(51) Int. Cl.
*B65G 1/04* (2006.01)
*B66C 13/06* (2006.01)

(52) U.S. Cl.
CPC ............ *B65G 1/0464* (2013.01); *B66C 13/06* (2013.01)

(58) Field of Classification Search
CPC .............................. B65G 1/0464; B66C 13/06
See application file for complete search history.

(56) References Cited

U.S. PATENT DOCUMENTS

| | | | |
|---|---|---|---|
| 9,385,019 B2* | 7/2016 | Fosnight | H01L 21/677 |
| 10,703,564 B2* | 7/2020 | Hognaland | B65G 1/0478 |
| 2012/0118845 A1* | 5/2012 | Wada | H01L 21/6773 |
| | | | 212/71 |
| 2015/0154839 A1* | 6/2015 | Stoddard | G08B 13/1445 |
| | | | 340/568.2 |
| 2017/0243775 A1 | 8/2017 | Kobayashi | |
| 2019/0217873 A1* | 7/2019 | Imahori | B61B 3/00 |
| 2019/0241406 A1 | 8/2019 | Kobayashi | |

FOREIGN PATENT DOCUMENTS

| | | |
|---|---|---|
| JP | S63-64371 B2 | 12/1988 |
| JP | 06-037264 U1 | 5/1994 |
| JP | 2000-012644 A | 1/2000 |
| JP | 2005-194009 A | 7/2005 |
| JP | 6344410 B2 | 6/2018 |
| WO | 2018/079146 A1 | 5/2018 |

* cited by examiner

*Primary Examiner* — Kyle O Logan
(74) *Attorney, Agent, or Firm* — DLA Piper LLP (US)

(57) ABSTRACT

An overhead transport vehicle includes an elevator including a base on which a holding device is provided, a plurality of suspension attaching portions to which each of the plurality of belts are attached and supporting the base to be vertically movable from below in a vertical direction via a vibration isolator, and a lock mechanism that fixes a relative positional relation between each of the plurality of suspension attaching portions and the base. The overhead transport vehicle further includes a controller that controls so that the lock mechanism is locked to fix a relative position relation at least partially during elevating operation of the elevator and also controls so that the lock mechanism is unlocked by releasing the lock at least partially during traveling operation of a body unit.

21 Claims, 11 Drawing Sheets

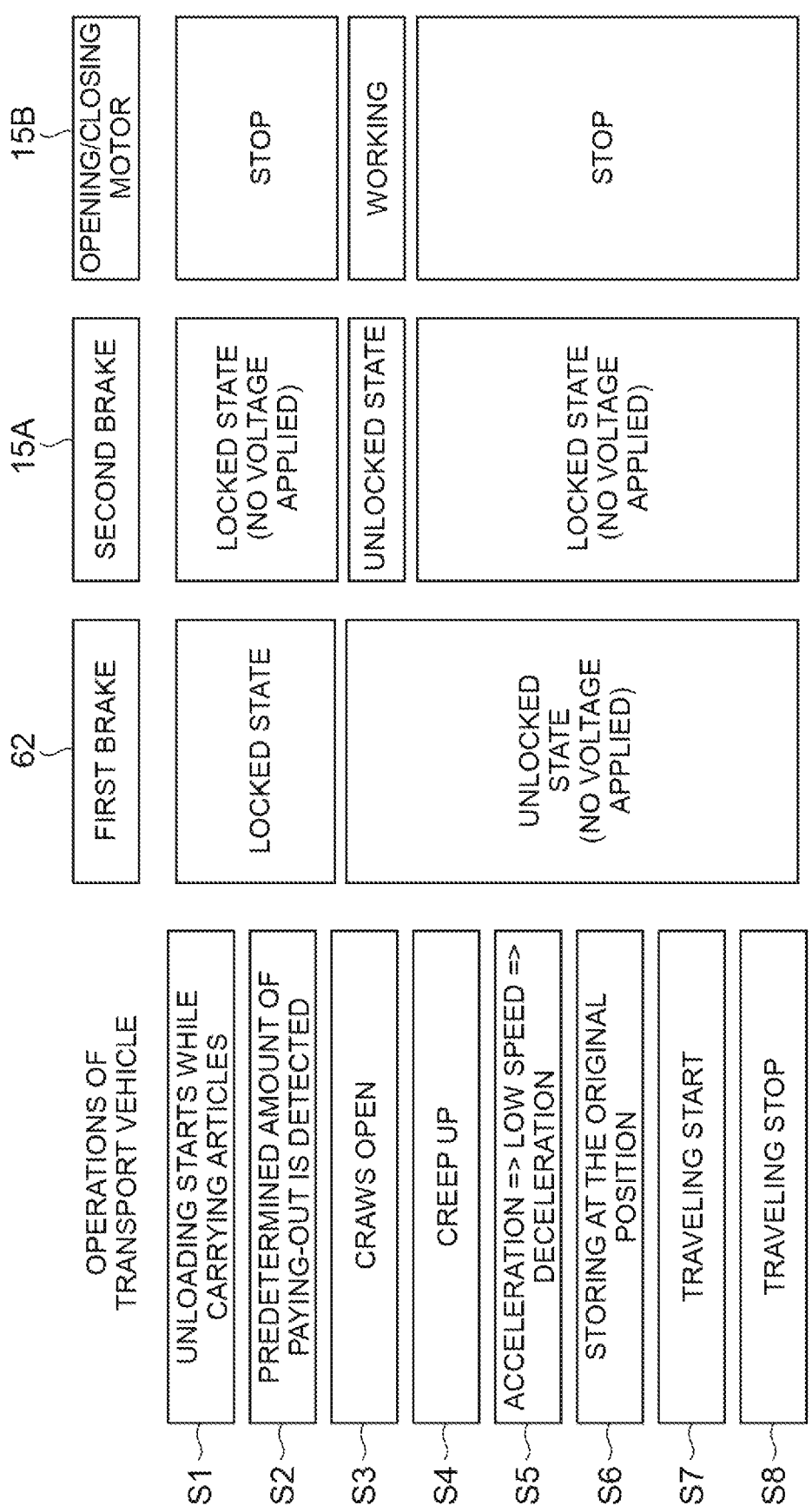

CEILING TRANSPORT VEHICLE

TECHNICAL FIELD

This disclosure relates to an overhead transport vehicle.

BACKGROUND

An overhead transport vehicle including a body unit capable of traveling along a rail, and an elevator configured to include a gripper to grip an article, and ascend and descend with respect to the body unit by winding and paying out a plurality of suspensions is known. For example, Japanese Unexamined Patent Publication No. 2017-145134 discloses an overhead transport vehicle configured to include an elevator including a base to which a gripper is attached, and a suspension attaching portion that supports the base to be vertically movable from below in a vertical direction via a vibration isolator and to which the suspension is fixed. The overhead transport vehicle according to JP '134 is capable of reducing vibrations transmitted to an article during travel.

In the above conventional overhead transport vehicle, vibrations transmitted to an article during travel can be reduced. However, the sway of the article occurs when the elevator ascends or descends to transfer the article and prevents an easy positioning of the article to be transferred, specifically, in the height direction.

It could therefore be helpful to provide an overhead transport vehicle capable of easily positioning an article to be transferred while reducing vibration transmitted to the article during travel.

SUMMARY

An overhead transport vehicle includes a body unit capable of traveling along a rail and an elevator that including a gripper configured to grip an article and to ascend and descend with respect to the body unit by a plurality of suspension members. The overhead transport vehicle also includes the elevator including a base to which the gripper is attached, a plurality of suspension attaching portions to which the plurality of suspension members are each attached, the plurality of suspension attaching portions each configured to support the base to be vertically movable from below in a vertical direction via a vibration isolator, and a lock mechanism configured to fix a relative positional relation between each of the plurality of suspension attaching portions and the base. The overhead transport vehicle further includes a controller configured to control the lock mechanism to be in a locked state to fix the relative position relation at least partially during elevating operation of the elevator, and also configured to control the lock mechanism to be in an unlocked state by releasing the locked state at least partially during traveling operation of the body unit.

In the overhead transport vehicle thus configured, the vibration isolator is provided between the suspension attaching portion to which each of the plurality of suspensions are attached and the base. Thereby vibration generated during travel is absorbed by the vibration isolator and is not easily transmitted to an article. In addition, the lock mechanism enters the locked state at least partially during elevating operation of the elevator so that vibration generated by the vibration isolator is reduced, allowing for an easy positioning of the article to be transferred. As a result, the article to be transferred is easily positioned while vibration transmitted to the article during travel is reduced.

The lock mechanism may include an interlocker provided at the base and capable of moving in accordance with a distance between the suspension attaching portion and the base, and a switch configured to switch the interlocker between a movable state and an immovable state. The switch may cause the lock mechanism to enter the locked state by switching the interlocker to the immovable state and may cause the lock mechanism to enter the unlocked state by switching the interlocker to the movable state. In the overhead transport vehicle thus configured, an operation of the vibration isolator to absorb vibration caused during travel is partially restricted and the restriction is released so that the lock mechanism can be switched between locked and unlocked. Therefore, the lock mechanism can be simply configured.

The switch may be a braking mechanism that causes the interlocker to enter the immovable state when voltage is applied and enter the movable state when no voltage is applied. The gripper may include claws configured to grip an article by being closed and to release the gripped article by being opened, a driving unit that opens or closes the claws, and the braking mechanism configured to lock opening and closing of the claws when no voltage is applied and to release the locked claws when voltage is applied. With this configuration, voltage is not applied simultaneously to two braking mechanisms included in the lock mechanism and in the gripper, respectively so that power consumption can be reduced.

The plurality of the suspension attaching portions may be coupled with each other by a link mechanism. The link mechanism may operate to ensure similarity of the respective distances between each of the suspension attaching portions coupled with each other and the base. The operation of the link mechanism is restricted so that the lock mechanism may enter a locked state. With this configuration, a rolling operation of the elevator during travel can be restricted and the lock mechanism can be simply configured.

The controller may be configured to control the lock mechanism to operate to enter the locked state while the elevating operation of the elevator is inactive. With this configuration, vibration caused by the locking operation of the lock mechanism can be reduced.

The controller may be configured to control the lock mechanism to operate to enter the locked state after the article is lifted from the transfer place at a predetermined distance. In the overhead transport vehicle having the above-described vibration isolator, the behavior occurs at the vibration isolator to absorb vibration when the article is lifted from the transfer place. The behavior is locked by the lock mechanism in the middle and then the lock is released so that the behavior may restart. This configuration enables a state in which the behavior of the vibration isolator converges, in other words, a state in which the lock mechanism is locked when the vibration isolator is counterpoised. Therefore, the article does not move up and down when the lock mechanism is in the unlocked state. This can reduce vibration generated by unlocking.

The controller may be configured to control the lock mechanism to operate to enter the locked state before the elevator starts to descend. With this configuration, the vibration generated by elevating operation of the elevator can be more surely reduced.

Vibration transmitted to an article during travel is reduced while the article to be transferred is easily positioned.

BRIEF DESCRIPTION OF THE DRAWINGS

FIG. 11 is a view showing the state of the first brake, the second brake, the opening/closing motor when an article is transferred in a laden state.

Figure 1:
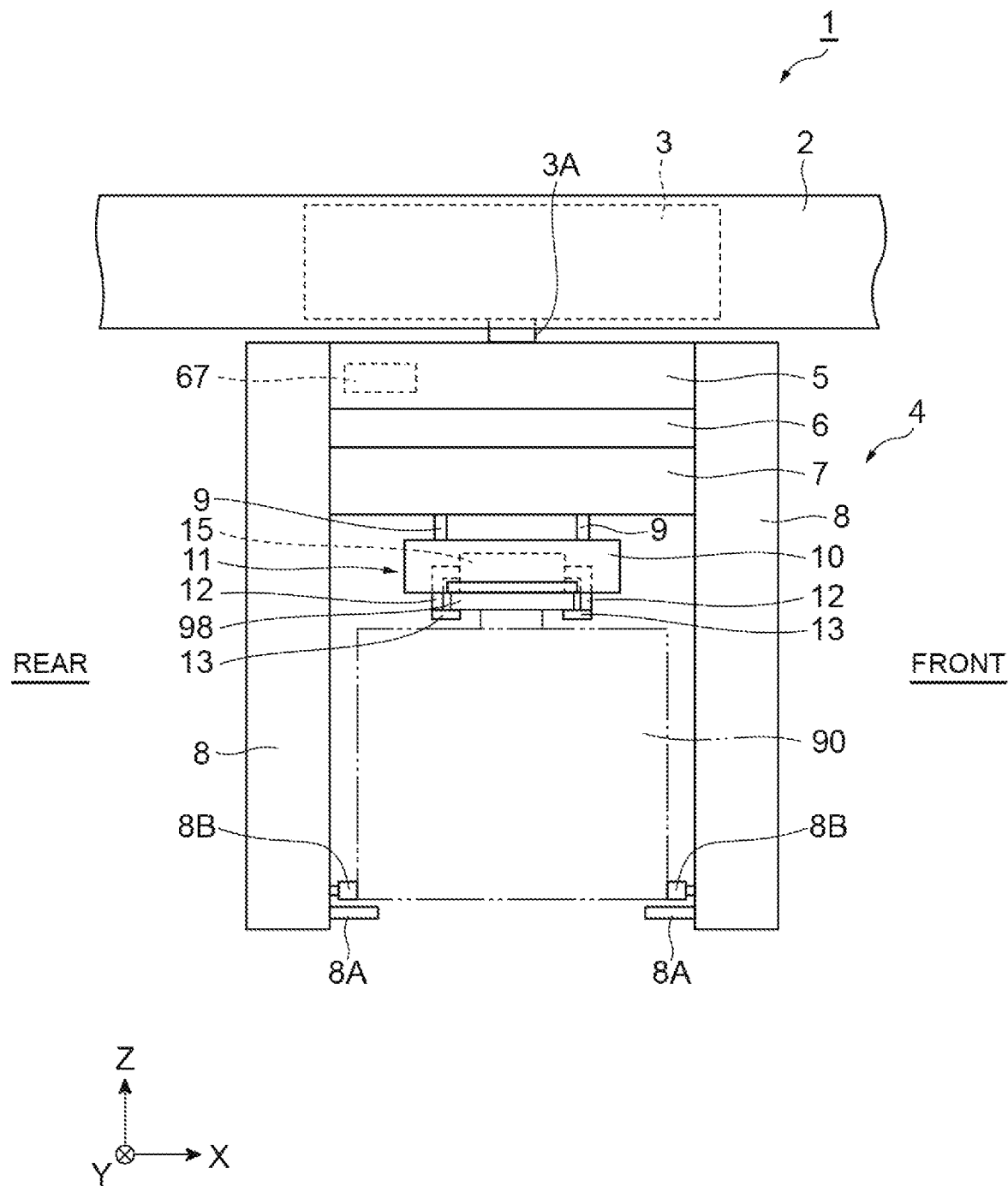
FIG. 1 is a front view of an overhead transport vehicle according to a preferred example.

REFERENCE SIGNS LIST 1 overhead transport vehicle
4 body unit
9 belt (suspension member)
10 elevator
10A base
13 claws
15 opening/closing mechanism
15A second brake
15B opening/closing motor
40 second suspension attaching portion (suspension attaching portion)
40A vibration isolator
50 first suspension attaching portion (suspension attaching portion)
50A vibration isolator
60 lock mechanism
61 gear mechanism
61A bearing
61B the axis
61C gear receiver
61D gear
62 first brake (switch)
67 controller
70 link mechanism
90 FOUP (article)

DETAILED DESCRIPTION

Hereinafter, with reference to the drawings, a preferred example of our vehicle will now be described. In the description of the drawings, the same elements will be denoted by the same reference symbols, without redundant descriptions.

Figure 2:
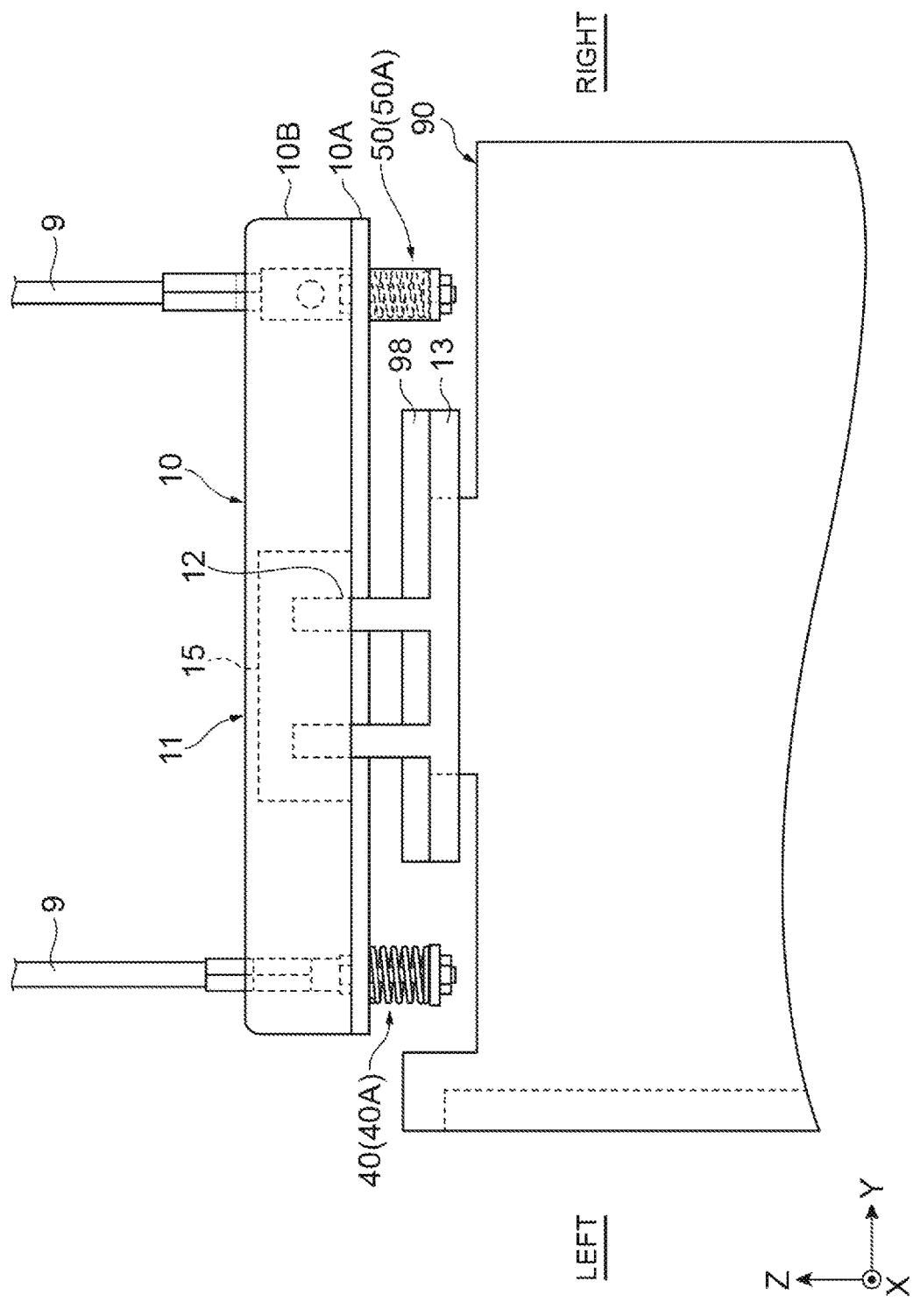
FIG. 2 is a side view of the overhead transport vehicle shown in FIG. 1 seen from the front.

FIG. 1 is a front view of an overhead transport vehicle according to a preferred example of our vehicle. FIG. 2 is a side view of the overhead transport vehicle shown in FIG. 1 seen from the front. FIGS. 1 and 2 do not show a link mechanism 70. The overhead transport vehicle 1 shown in FIG. 1 travels along a traveling rail (track) 2 installed at the position higher than a floor such as a ceiling of a clean room. An overhead transport vehicle 1 conveys an article such as FOUP (Front Opening Unified Pod) 90 or a reticle pod between a storage facility and a predetermined load port. FOUP 90 accommodates, a plurality of semiconductor wafers, for example. FOUP 90 includes a flange 98 held by the overhead transport vehicle 1.

In the following description, for the convenience of explanation, the left-right direction (X direction) of FIG. 1 is referred to as the front-rear direction of the overhead transport vehicle 1. The vertical direction of FIG. 1 is referred to as the vertical direction (Z direction) of the overhead transport vehicle 1. The depth direction of FIG. 1 is referred to as the left-right direction or width direction (Y direction) of the overhead transport vehicle 1. X-axis, Y-axis, and Z-axis are perpendicular to each other.

Figure 3:
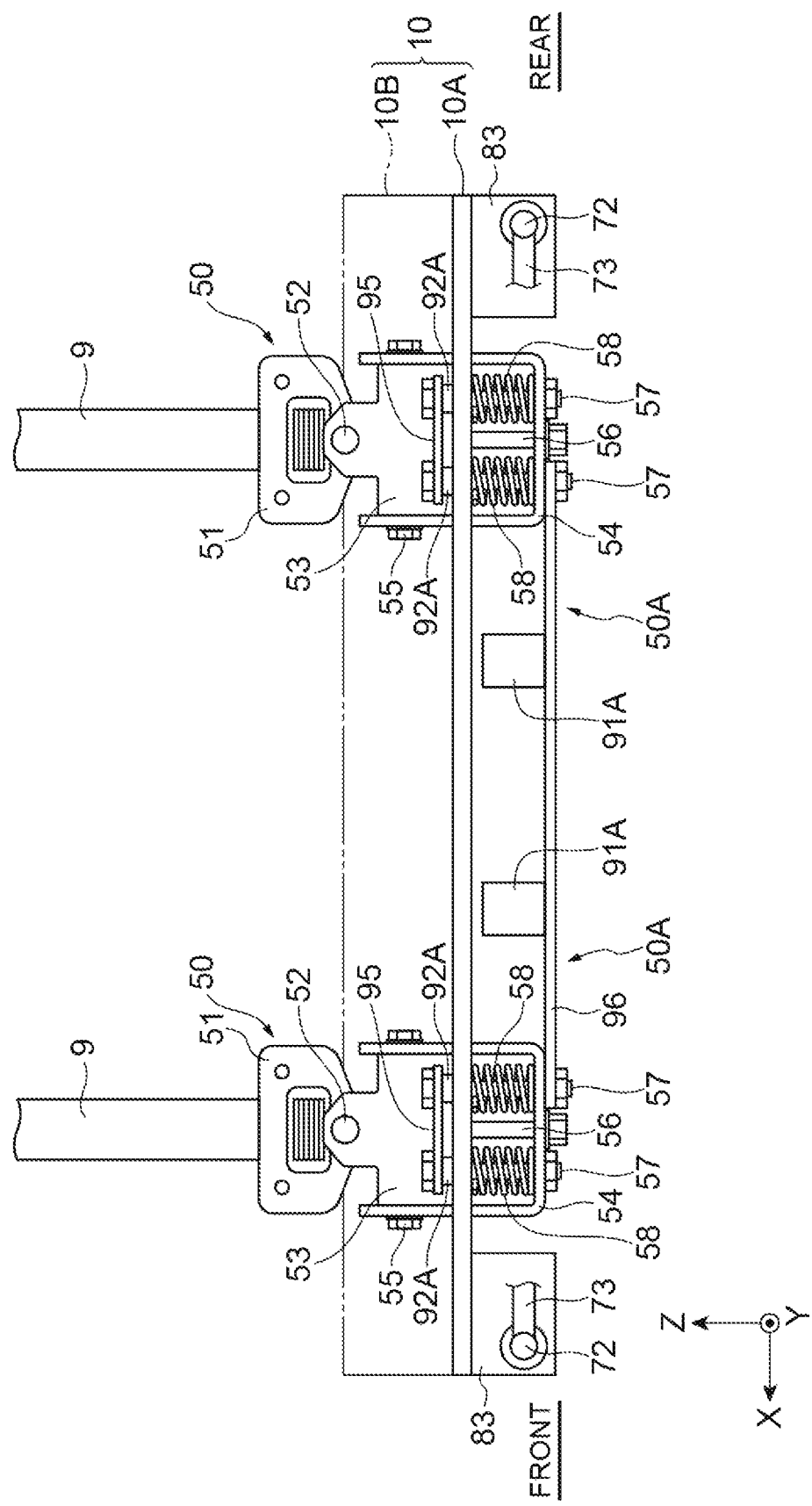
FIG. 3 is a front view of a first suspension attaching portion seen from the right.
Figure 4:
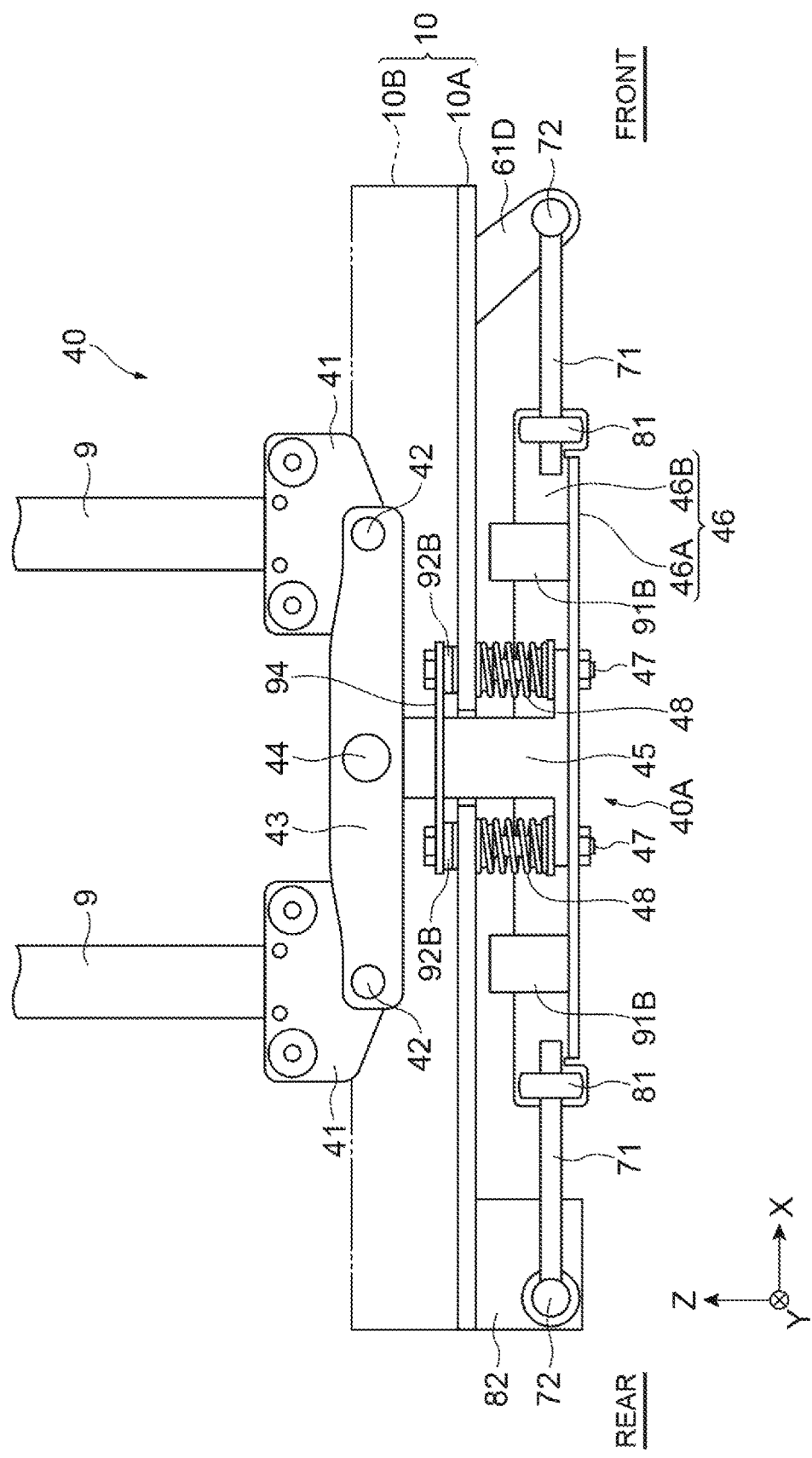
FIG. 4 is a front view of a second suspension attaching portion seen from the left.
Figure 5:
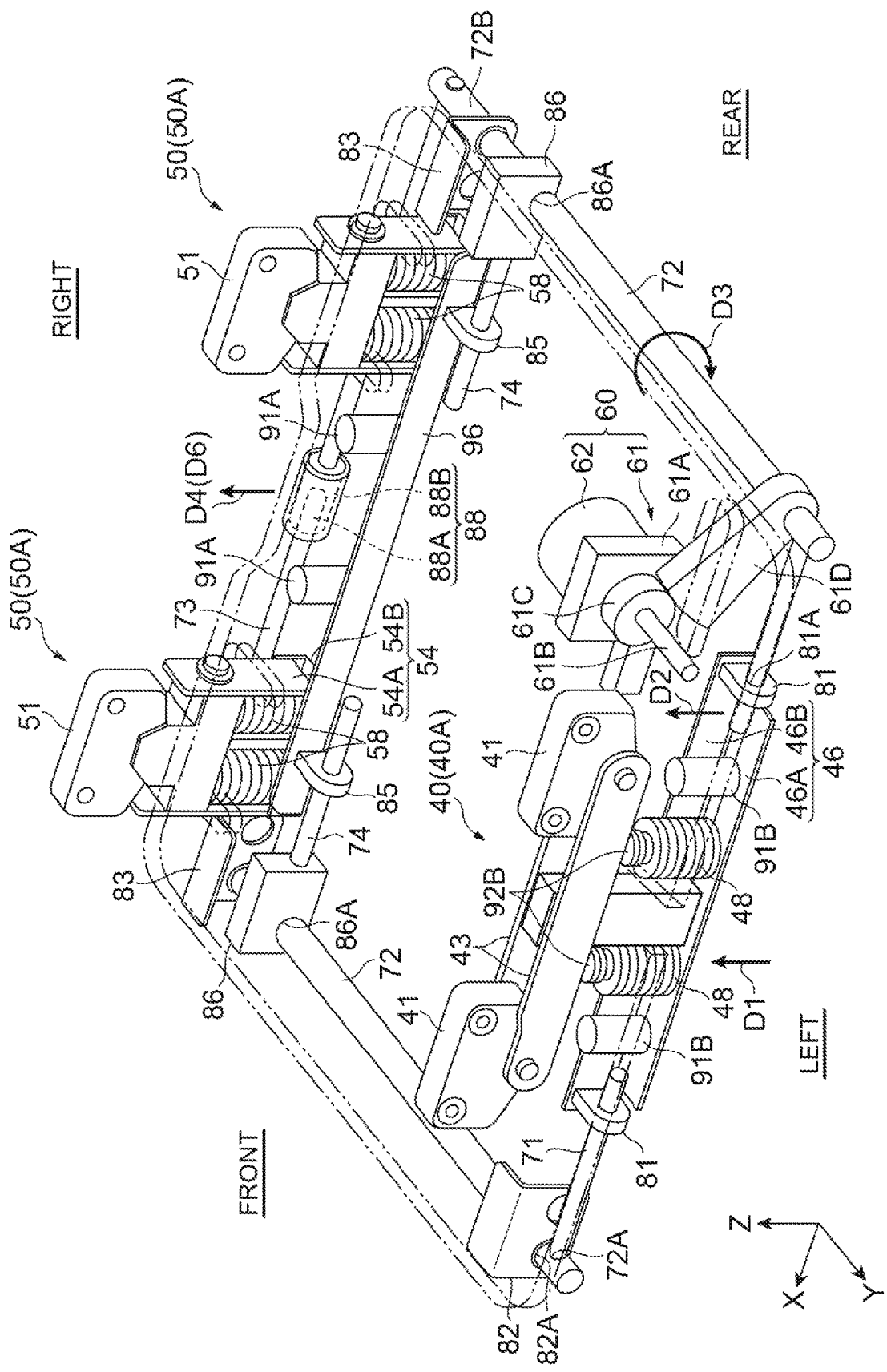
FIG. 5 is a perspective view of a link mechanism.

As shown in FIG. 1, the overhead transport vehicle 1 includes a body unit 4 and an elevator 10. The body unit 4 includes a traveling drive unit 3, a horizontal drive unit (body unit) 5, a rotary drive unit (body unit) 6, a lifting drive unit (body unit) 7, and a controller 67. The elevator 10 includes a holding device (gripper) 11, a first suspension attaching portion (suspension attaching portion) 50 as shown in FIG. 3, a second suspension attaching portion (suspension attaching portion) 40 as shown in FIG. 5, a link mechanism 70 as shown in FIG. 4, and a lock mechanism 60 as shown in FIG. 5.

The overhead transport vehicle 1 is provided with a pair of covers 8, 8 in the front-rear direction to cover the horizontal drive unit 5, the rotary drive unit 6, the lifting drive unit 7, the elevator 10, and the holding device 11. The pair of covers 8, 8 form a space to accommodate FOUP 90 below the holding device 11 when the elevator 10 has reached the upward end. A fall-preventing mechanism 8A prevents FOUP 90 held by the holding device 11 from dropping when the elevator 10 has reached the upward end. A swaying suppression mechanism 8B prevents FOUP 90 held by the holding device 11 from swinging in the front-rear direction (traveling direction) and left-right direction of the overhead transport vehicle 1 during travel.

The traveling drive unit 3 that drives the overhead transport vehicle 1 to travel along the traveling rail 2 is arranged in the traveling rail 2. The traveling drive unit 3 drives a roller (not shown) traveling on the traveling rail 2. The horizontal drive unit 5 is provided below the traveling drive unit 3 via an axis 3A. The horizontal drive unit 5 drives the rotary drive unit 6, the lifting drive unit 7, and the elevator 10 to move within the horizontal plane in the direction (left-right direction) perpendicular to the extending direction of the traveling rail 2. The rotary drive unit 6 drives the lifting drive unit 7 and the elevator 10 to rotate within the horizontal plane. The lifting drive unit 7 drives the elevator 10 to ascend and descend by winding and paying out four belts (suspension member) 9. An appropriate means of suspension such as a wire or a rope may be used instead of the belts 9 attached to the lifting drive unit 7.

As shown in FIGS. 1 and 2, the elevator 10 is provided to be vertically movable by the lifting drive unit 7 and serves as an elevating platform in the overhead transport vehicle 1. The elevator 10 includes the holding device 11 that grips FOUP 90 and is lifted up by the belts 9 with respect to the horizontal drive unit 5, the rotary drive unit 6 and the lifting drive unit 7 included in the body unit. The holding device 11 holds FOUP 90. The holding device 11 includes a pair of L-shaped arms 12, 12, claws 13, 13 each fixed to arms 12, 12, and an opening/closing mechanism 15 to open/close the pair of arms 12, 12.

Figure 9:
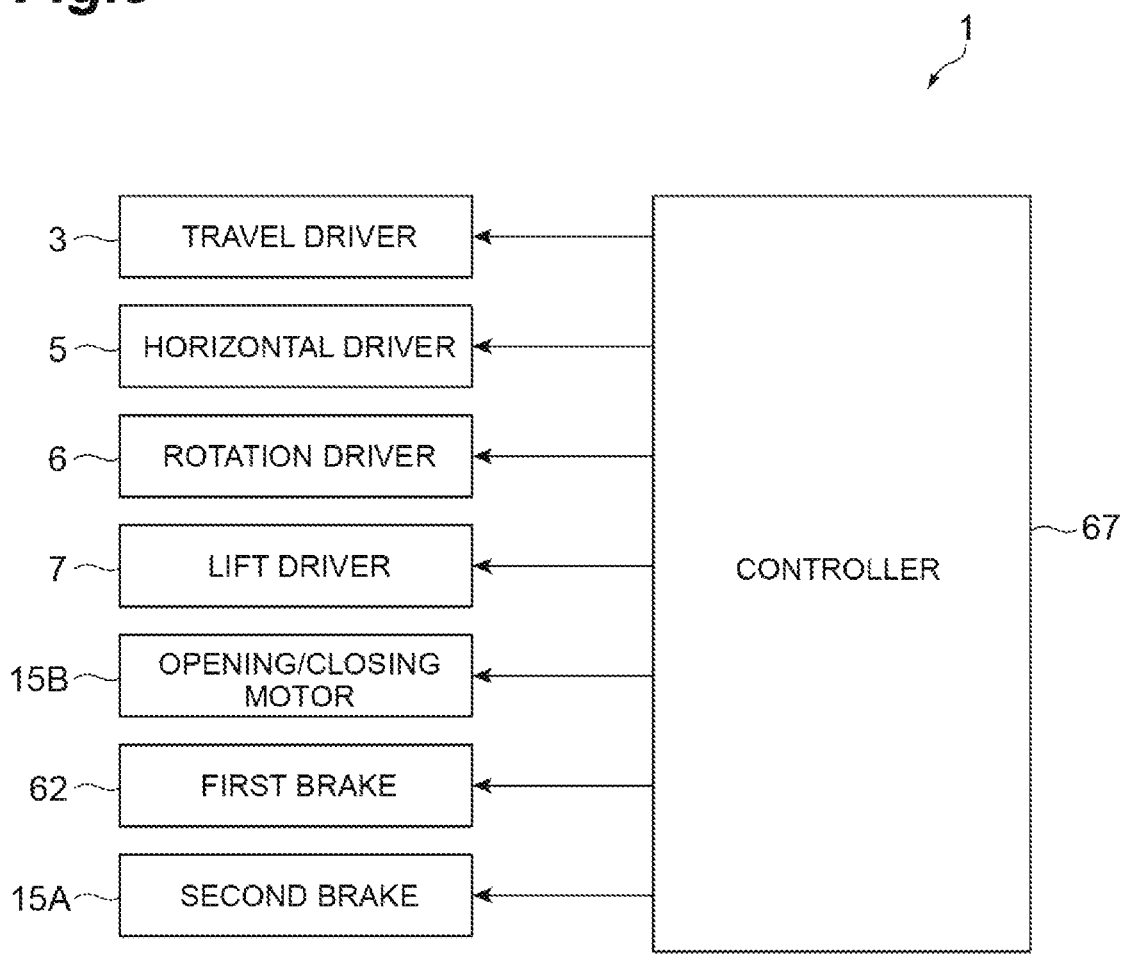
FIG. 9 is a block diagram showing a functional structure of the overhead transport vehicle shown in FIG. 1.

The pair of arms 12, 12 are provided at the opening/closing mechanism 15. The opening/closing mechanism 15 moves the pair of arms 12, 12 in the direction close to each other or in the direction far from each other. The pair of arms 12, 12 are advanced/retreated in the front-rear direction by the operation of the opening/closing mechanism 15. Thereby, the pair of claws 13, 13 fixed to the arms 12, 12 open or close. The opening/closing mechanism 15 includes a second brake 15A as shown in FIG. 9 and an opening/closing motor (driving unit) 15B as shown in FIG. 9. The second brake 15A, which is a non-excitation operative brake, locks opening/closing of the claws 13, 13 when no voltage is applied and releases the lock when a voltage is applied. The opening/closing motor 15B opens/closes the claws 13, 13.

In the present preferred example, when the pair of the claws 13, 13 are open, the height of the holding device 11 (elevator 10) is adjusted so that the holding surfaces of the claws 13 are placed below the lower surface of the flange 98. The pair of the claws 13, 13 are closed in this state so that the holding surfaces of the claws 13, 13 are extended below the lower surface of the flange 98. Then, the elevator 10 is lifted up in this state so that the flange 98 is gripped by the pair of the claws 13, 13 to support FOUP 90.

The elevator 10 includes a base 10A on which the holding device 11 is provided, a cover 10B covering the base 10A, a first suspension attaching portion 50 that supports the base 10A to be vertically movable from below in a vertical direction via the vibration isolator 50A, and a second suspension attaching portion 40 that supports the base 10A to be vertically movable from below in a vertical direction via the vibration isolator 40A.

FIG. 3 is a front view showing the outline of the first suspension attaching portion and FIG. 4 is a front view showing the outline of the second suspension attaching portion. For convenience of explanation, FIG. 3 does not show a part of a first body member 54 (to be described later) and a part of the link mechanism 70 connected to the first suspension attaching portion 50. As shown in FIGS. 3 and 4, the first suspension attaching portion 50 and the second suspension attaching portion 40 are mechanisms to couple the belts 9 with the elevator 10 as shown in FIG. 1 and to prevent vibration generated by traveling of the traveling drive unit 3 or by ascending/descending of the elevator 10 from being transmitted to FOUP 90.

As shown in FIG. 2, the first suspension attaching portion 50 is provided at the right side of the elevator 10 in the left-right direction. As shown in FIG. 3, the first suspension attaching portion 50 is arranged at two places in the front-rear direction. The first suspension attaching portion 50 includes a connection member 51, a swing member 53, the first body member 54, a second body member 56, a first axes 57, 57, a coupler 96, a damper 95, and the vibration isolator 50A. The vibration isolator 50A includes a pair of first biasing portions 58, 58, a pair of second biasing portions 91A, 91A, and a pair of third biasing portions 92A, 92A.

Figure 6:
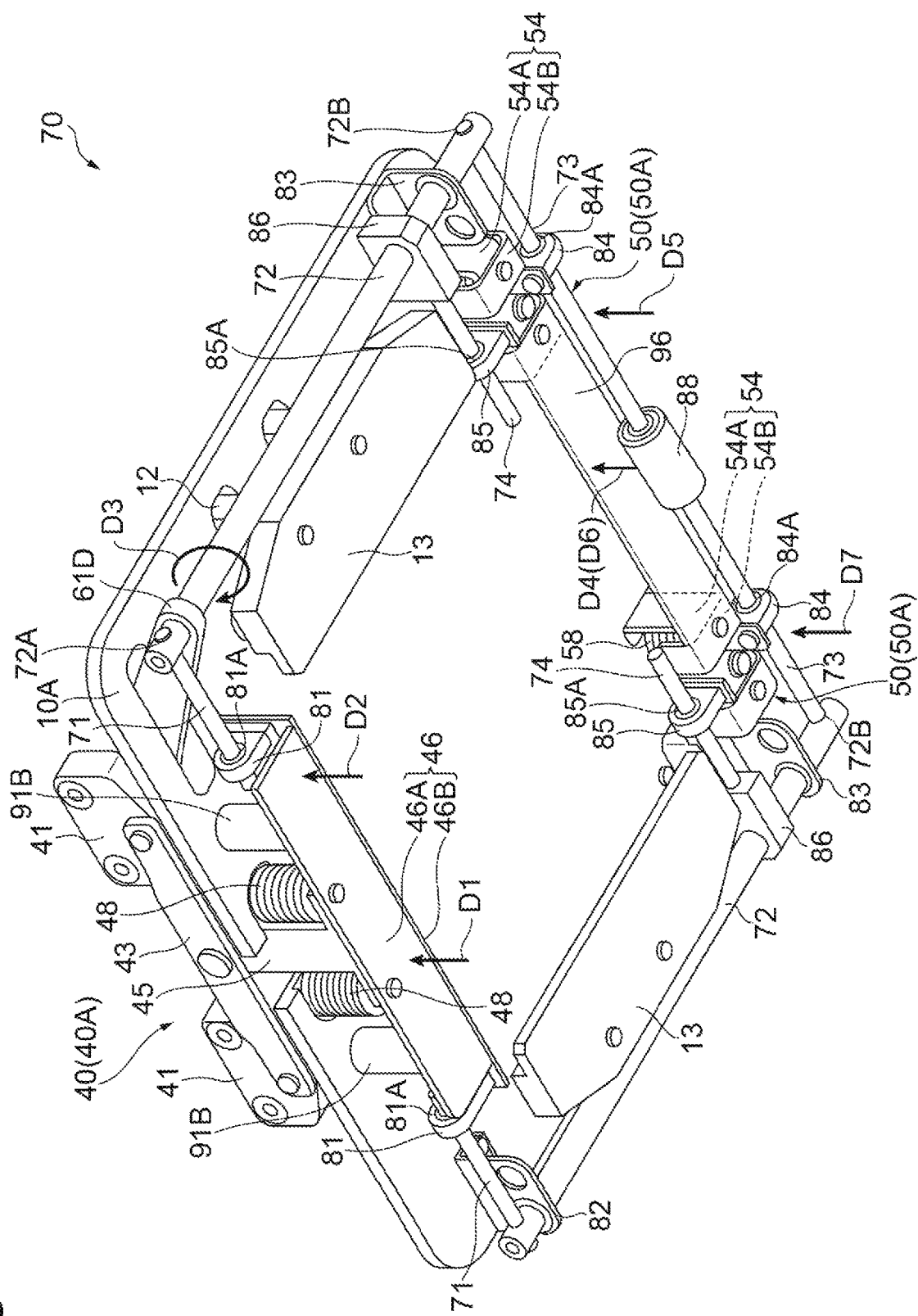
FIG. 6 is a perspective view of the link mechanism arranged on the rear side of a base.

The connection member 51 is attached to the belt 9. The swing member 53 is coupled with the connection member 51. The swing member 53 is rotatably coupled with the connection member 51 via a first pin 52. The first body member 54 is formed in a substantially U-shape such that the top edge thereof is open and the bottom thereof is flat in the horizontal direction. The upper edges of the first body member 54 are coupled with the both edges of the swing member 53 with bolts 55. The first body member 54 includes a first supporter 54A as shown in FIGS. 5 and 6) and a second supporter 54B as shown in FIGS. 5 and 6).

The first supporter 54A supports the first biasing portion 58 from below. The second supporter 54B is perpendicular to the first supporter 54A. A second body member 56 couples the center or the substantial center of the swing member 53 with the center or the substantial center of the first body member 54 in the front-rear direction. A pair of the first axes 57, 57 are in a bar-shape extending upwards from the first supporter 54A and arranged at both sides of the second body member 56 in the front-rear direction. An edge of the first axis 57 at the side of the base 10A inserts into an insertion hole formed on the base 10A and is fixed to the base 10A with the damper 95 that clamps the base 10A.

The pair of first biasing portions 58, 58 are compression coil springs having predetermined spring constants. The pair of first axes 57, 57 inserts into the first biasing portions 58, 58, respectively. The top edges of the pair of first biasing portions 58, 58 are in contact with the base 10A and the bottom edges thereof are in contact with the first supporter 54A. In other words, the pair of the first biasing portions 58, 58 are provided to be in contact with both of the first supporter 54A and the base 10A and bias in the direction to keep the first supporter 54A and the base 10A away from each other. The first biasing portion 58 functions as a vibration isolator to reduce vibration transmitted to the members in contact with each other.

The pair of second biasing portions 91A, 91A are made of urethane rubber and have viscoelasticity. The second biasing portions 91A, 91A are disposed such that the top edges thereof are away from the base 10A and the bottom edges thereof are in contact with the first supporter 54A. In other words, the pair of second biasing portions 91A, 91A are in contact only with the first supporter 54A. If a load more than a predetermined weight is applied to the first biasing portions 58, 58, the pair of second biasing portions 91A, 91A come in contact with both of the coupler 96 and the base 10A and bias in the direction to keep the coupler 96 and the base 10A away from each other.

The pair of third biasing portions 92A, 92A are made of urethane rubber and have viscoelasticity. The pair of third biasing portions 92A, 92A are each disposed between the base 10A and the damper 95. The pair of third biasing portions 92A, 92A are in contact with both of the base 10A and the clamper 95, and bias in the direction to keep the base 10A and the damper 95 away from each other.

As shown in FIG. 2, the second suspension attaching portion 40 is provided at the left side of the elevator 10 in the left-right direction. As shown in FIG. 4, the second suspension attaching portion 40 is provided in the vicinity of the center in the front-rear direction. The second suspension attaching portion 40 includes a connection members 41, 41, a swing member 43, a third body member 45, a fourth body member 46, second axes 47, 47, a damper 94, and the vibration isolator 40A. The vibration isolator 40A includes a pair of first biasing portions 48, 48, a pair of second biasing portions 91B, 91B, and a pair of third biasing portions 92B, 92B.

The connection members 41, 41 are members to which the belts 9, 9 are attached. The swing member 43 couples the pair of connection members 41, 41 with the third body unit 45. The pair of connection members 41, 41 are rotatably coupled with the swing member 43 in both directions via a pair of third pins 42, 42. The swing member 43 is rotatably coupled with the third body member 45 in both directions via a fourth pin 44.

The fourth body member 46, which is coupled with the bottom edge of the third body member 45, extends in the horizontal direction. The fourth body member 46 includes a third supporter 46A and a fourth supporter 46B. The third body member 45 supports the first biasing portions 48, 48 from below. The third supporter 46A supports the second biasing portions 91B, 91B from below. The fourth supporter 46B is perpendicular to the third supporter 46A. The pair of second axes 47, 47, which extend upwards from the bottom edge of the third body member 45, are arranged at both sides of the third body member 45 in the front-rear direction. An edge of the second axis 47 at the side of the base 10A inserts into the insertion hole formed on the base 10A and is fixed to the base 10A with the damper 94 that clamps the base 10A.

The pair of first biasing portions 48, 48 are compression coil springs having a predetermined spring constants. The pair of second axes 47, 47 insert into the first biasing portions 48, 48, respectively. The top edges of the pair of first biasing portions 48, 48 are in contact with the base 10A and the bottom edges thereof are in contact with the third body member 45. In other words, the pair of the first biasing portions 48, 48 are provided in contact with both of the third body member 45 and the base 10A and bias in the direction to keep the third body member 45 and the base 10A away from each other. The first biasing portion 48 functions as a vibration isolator to reduce vibration transmitted to the members in contact with each other.

The pair of second biasing portions 91B, 91B are made of urethane rubber and have viscoelasticity. The second biasing portions 91B, 91B are disposed such that the top edges thereof are away from the base 10A and the bottom edges thereof are in contact with the third supporter 46A. In other words, the pair of second biasing portions 91B, 91B are in contact only with the third supporter 46A. If a load more than a predetermined weight is applied to the first biasing portions 48, 48, the pair of second biasing portions 91B, 91B come in contact with both of the third supporter 46A and the base 10A and bias in the direction to keep the third supporter 46A and the base 10A away from each other.

The pair of third biasing portions 92B, 92B are made of urethane rubber and have viscoelasticity. The pair of third biasing portions 92B, 92B are each disposed between the base 10A and the damper 94. The pair of third biasing portions 92B, 92B are in contact with both of the base 10A and the clamper 94, and bias in the direction to keep the base 10A and the damper 94 away from each other.

Figure 7:
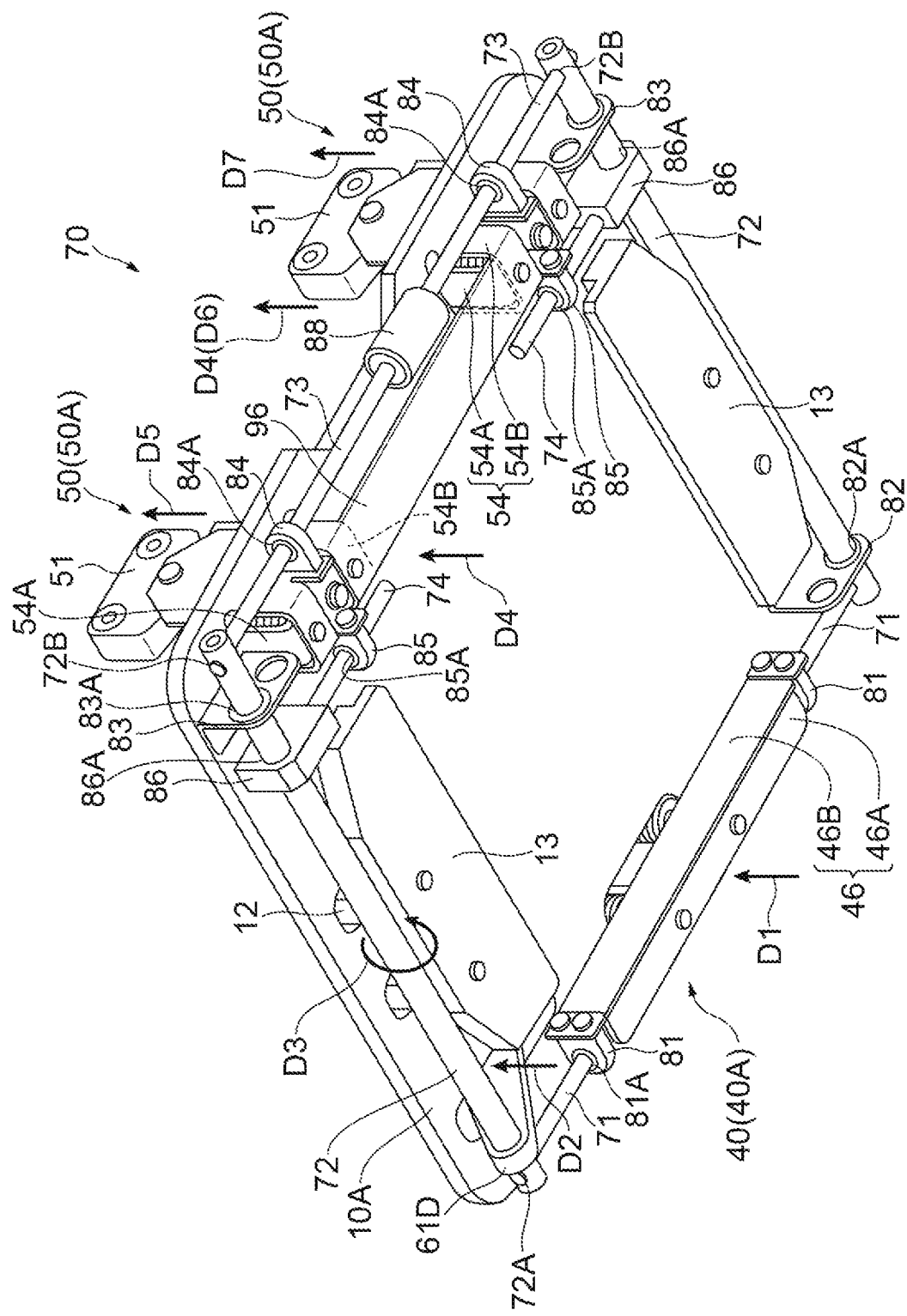
FIG. 7 is a perspective view of the link mechanism arranged on the rear side of a base.

As shown in FIGS. 5 to 7, the link mechanism 70 couples between two of the first suspension attaching portions 50 and the second suspension attaching portion 40 that are arranged in the left-right direction (width direction) perpendicular to both of the front-rear direction (traveling direction) and the vertical direction (perpendicular direction) with each other and further couples two of the first suspension attaching portions 50, 50 arranged in the front-rear direction with each other. The link mechanism 70 operates to ensure similarity of respective distances between the first body member 54 (coupler 96) in the first suspension attaching portion 50 and base 10A and between the fourth body member 46 in the second suspension attaching portion 40 and the base 10A. In addition, the link mechanism 70 operates to ensure similarity of respective distances between the first body member 54 in the first suspension attaching portion 50 arranged at left side and the base 10A and between the first body member 54 in the first suspension attaching portion 50 arranged at right side and the base 10A. Hereinafter, the link mechanism 70 will be described in detail.

The link mechanism 70 includes a first shaft 71, a second shaft 72, a third shaft 73, a fourth shaft 74, a first bush 81, a first block 82, a second block 83, a second bush 84, a third bush 85, a fixing portion 86, and a coupling portion 88.

The first shaft 71 is supported by the first bush 81 fixed to the fourth supporter 46B included in the second suspension attaching portion 40 and extends in the front-rear direction. The first shaft 71 is inserted into an insertion hole 81A formed on the first bush 81 and provided to be capable of rotating with respect to the first bush 81 and sliding in the axis direction. A material for the first bush 81 is appropriately selected so that the first shaft 71 has a predetermined rotation capacity and a predetermined sliding property. Two of the first shafts 71 arranged in the front-rear direction are disposed in a substantially straight line in the front-rear direction. The first shafts 71 are on straight line with the second axes 47, 47 as shown in FIG. 4 that insert into the pair of first biasing portions 48, 48, respectively.

The third shaft 73 is supported by the second bush 84 fixed to the second supporter 54B included in the first suspension attaching portion 50 and extends in the front-rear direction. The third shaft 73 is inserted into an insertion hole 84A formed on the second bush 84 and provided to be capable of rotating with respect to the second bush 84 and sliding in the axis direction. The fourth shaft 74 is supported by the third bush 85 fixed to the second supporter 54B included in the first suspension attaching portion 50 and extends in the front-rear direction. The fourth shaft 74 is inserted into an insertion hole 85A formed on the third bush 85 and provided to be capable of rotating with respect to the third bush 85 and sliding in the axis direction. As with the first bush 81, materials also for the second bush 84 and the third bush 85 are appropriately selected so that the third shaft 73 and the fourth shaft 74 has a predetermined rotation capacity and a predetermined sliding property.

The third shaft 73 and the fourth shaft 74 are arranged at both sides of the first suspension attaching portion 50 in parallel to each other. Two of the third shafts 73, 73 arranged in the front-rear direction are disposed in a straight line in the front-rear direction and coupled with each other via the coupling portion 88 (to be described later). Two of the fourth shafts 74, 74 arranged in the front-rear direction are disposed in a straight line in the front-rear direction.

The second shaft 72, which is supported by the first block 82 (or a gear 61D which is a part of the lock mechanism 60 to be described later) and the second block 83 fixed to bottom surface of the base 10A, extends in the left-right direction. The second shaft 72 is inserted into an insertion hole 83A formed on the second block 83 and provided to be capable of rotating with respect to the second block 83 and sliding in the axis direction.

One edge of the second shaft 72 in the left-right direction is coupled with the first shaft 71. In particular, an edge of the first shaft 71 is inserted into an insertion hole 72A formed on the second shaft 72. The other edge of the second shaft 72 in the left-right direction is coupled with the third shaft 73. In particular, an edge of the third shaft 73 is inserted into an insertion hole 72B formed on the second shaft 72. The second shaft 72 is coupled with the fourth shaft 74 between the first block 82 (or the gear 61D) and the second block 83 in the left-right direction. The second shaft 72 is coupled with the fourth shaft 74 via the fixing portion 86 fixed to the bottom surface of the base 10A. The fixing portion 86 absorbs the fit tolerance of the fourth shaft 74 and the second shaft 72.

When the overhead transport vehicle 1 is seen from the right, the third shaft 73 coupled with the first suspension attaching portion 50 disposed at the front side and the third shaft 73 coupled with the first suspension attaching portion 50 disposed at the rear side are coupled with each other via the coupling portion 88. The coupling portion 88 is located in the substantially central position of the two second bushes 84, 84 arranged in the front-rear direction. The coupling portion 88 includes an inserted portion 88A having the inner diameter larger than the outer diameter of the third shaft 73 arranged in the front side. The third shaft 73 is fixed, for example, at a place within the inserted portion 88A via a supporter such as a resin. Thereby, the third shaft 73 is capable of moving within the inserted portion 88A in the vertical and horizontal direction.

As shown in FIGS. 5, 6, 7, 8(A), and 8(B), the lock mechanism 60 fixes a relative positional relation (a relative position of the base 10A with respect to the first body member 54 and a relative position of the first body member 54 with respect to the base 10A) between the body member 54 (the coupler 96) included in the first suspension attaching portion 50 and the base 10A. The lock mechanism further fixes a relative positional relation (a relative position of the base 10A with respect to the fourth body member 46 and a relative position of the fourth body member 46 with respect to the base 10A) between the fourth body member 46 included in the second suspension attaching portion 40 and the base 10A. The state in which the relative positional relation between both of members is fixed by the lock mechanism 60 is referred to as 'a locked state.' The lock mechanism 60 is provided at the base 10A and includes a gear mechanism (interlocker) 61 and a first brake (switch) 62.

The gear mechanism 61 includes a bearing 61A, an axis 61B, a gear receiver 61C, and the gear 61D. The bearing 61A is fixed to the base 10A. The axis 61B is rotatably provided at the bearing 61A. The gear receiver 61C, which is in a cylindrical shape, is attached to the axis 61B. The gear receiver 61C is provided to be capable of rotating along with rotation of the axis 61B. One edge of the gear 61D is fixed to the second shaft 72. The other edge of the gear 61D is arranged to be in contact with the outer periphery of the gear receiver 61C.

Figure 8:
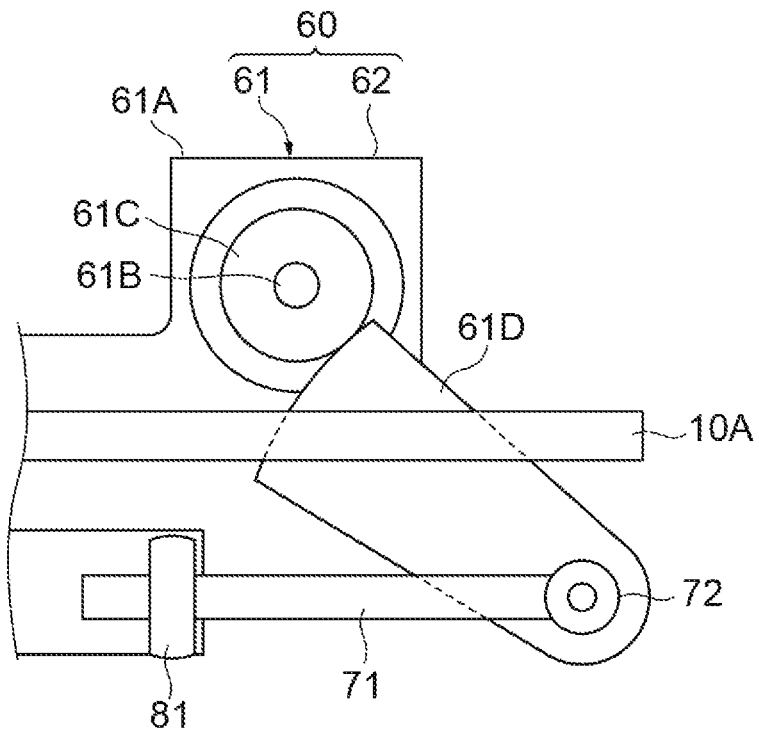
FIG. 8(A) is an expanded view of a lock mechanism and FIG. 8(B) is an expanded view of the lock mechanism when the link mechanism is active.
Figure 8:
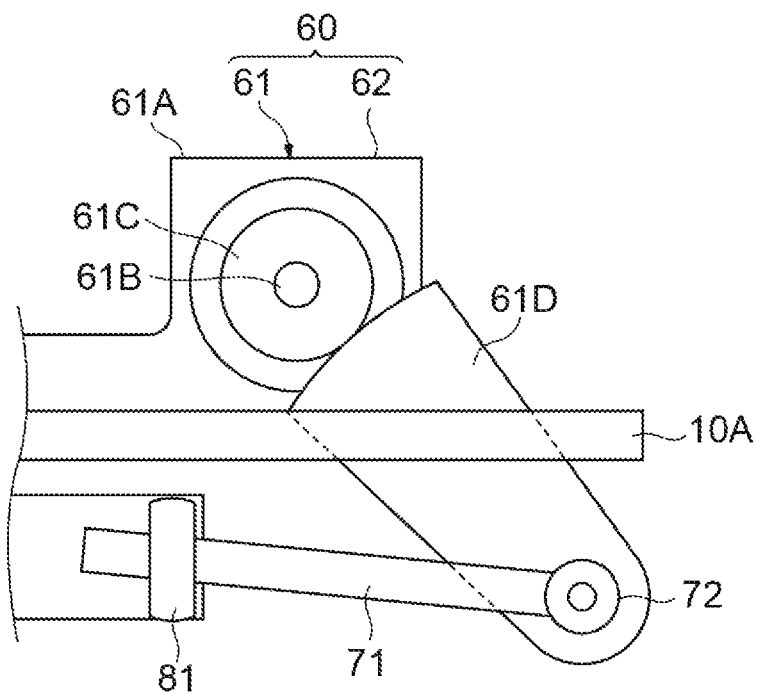

When the gear receiver 61C is in a rotatable state (in an unlocked state (to be described later)) and one edge of the gear 61D rotationally moves along with the movement of the second shaft 72, the other edge of the gear 61D works together with the gear receiver 61C and oscillates in contact with the outer periphery of the gear receiver 61C as shown in FIGS. 8(A) and 8(B). In other words, the gear 61D is capable of moving according to the distance between the first body member 54 (coupler 96) included in the suspension attaching portion 50 and the base 10A and the distance between the fourth body member 46 included in the suspension attaching portion 40 and the base 10A.

The first brake 62 switches the gear receiver 61C included in the gear mechanism 61 between movable and immovable state. In other words, the first brake 62 switches the axis 61B rotatably provided at the axis receiver 61A between rotatable and nonrotatable state. The first brake 62, which is an excitation operative brake, causes the axis 61B to be in a nonrotatable state when the voltage is applied and to be in a rotatable state when no voltage is applied. The first brake 62 causes the lock mechanism 60 to be in the locked state by making the gear receiver 61C nonmovable and to be in the unlocked state by making the gear receiver 61C movable.

As shown in FIG. 9, the controller 67 is an electronic control unit made up of CPU (Central Processing Unit), ROM (Read Only Memory), RAM (Random Access Memory), and the like. The controller 67 controls a variety of operations in the overhead transport vehicle 1. The controller 67 controls the traveling drive unit 3, the horizontal drive unit 5, the rotary drive unit 6, the lifting drive unit 7, the first brake 62, the second brake 15A, and the opening/closing motor 15B. The controller 67 may be configured, for example, as software in which a program stored in ROM is loaded on RAM and executed by CPU. The controller 67 may be also configured as hardware which is an electronic circuit or the like. The controller 67 communicates with the upper controller (not shown) using the power supply unit (power supply line of the traveling rail 2 or feeder wire).

The controller 67 according to the preferred example makes the lock mechanism 60 enter the locked state at least partially during elevating operation of the elevator 10 and release the locked state at least partially during traveling operation of the body unit 4 to make the lock mechanism 60 enter the unlocked state. The controller 67 further controls the first brake 62 so that the lock mechanism is in the locked state while the elevating operation of elevator 10 is inactive.

In more detail, after recognizing that FOUP 90 is lifted up from the transfer place of FOUP 90 at a predetermined distance, the controller 67 controls the lock mechanism 60 to operate to be in the locked state based on winding amount of the belt 9. FOUP 90 is lifted up by the elevator 10 so that the first biasing portion 58 included in the first suspension attaching portion 50 is temporarily compressed and then expands again. After repeating this operation, the first biasing portion 58 enters a counterpoised state. Also, the first biasing portion 48 of the second suspension attaching portion 40 is temporarily compressed and expands again. After repeating this operation, the first biasing portion 48 enters a counterpoised state. The above 'a predetermined distance,' which is a distance at the timing of the above counterpoised state, is appropriately determined based on the weight of FOUP 90, the weight of the articles to be accommodated in FOUP 90, and the rising speed of the elevator 10. The controller 67 controls the first brake 62 to operate so that the lock mechanism 60 is in the locked state before the elevator 10 starts to descend.

With reference to FIG. 3, an example of operations of the first suspension attaching portion 50 will now be described. To prevent the first biasing portion 58 from being compressed when the holding device 11 grips an empty FOUP 90, the pressurization is previously applied to the first biasing portion 58 which is a compression spring. The first biasing portion 58 is compressed to obtain the same repulsion as the total weight of the base 10A, the holding device 11, and the empty FOUP 90. Thus, the holding device 11 grips FOUP 90 accommodating any articles, and the load larger than the first predetermined weight acts on the first biasing portion 58 so that the first biasing portion 58 is compressed. If any relatively light articles are accommodated in the FOUP 90 (if amount of compression of the first biasing portion 58 is equal to or less than the predetermined value), the base 10A does not come into contact with an edge of the second biasing portion 91A. Therefore, the base 10A is supported by the first body member 54 (coupler 96) only via the first biasing portion 58.

If the load of the second predetermined weight even larger than the first predetermined weight acts on the first biasing portion 58, the first biasing portion 58 is further compressed and the base 10A comes into contact with the edge of the second biasing portion 91A. Therefore, the base 10A is supported by the first body member 54 (coupler 96) via the first biasing portion 58 and the second biasing portion 91A. Compared to being supported by the first body member 54 (coupler 96) only via the first biasing portion 58, when the base 10A is supported by the body member 54 (coupler 96) via the first biasing portion 58 and the second biasing portion 91A, the amount of sinking with respect to the same weight (amount of approaching between the base 10A and the first body member 54 (coupler 96)) is smaller. Therefore, coefficient of restitution of the vibration isolator 50A is changed when the load of the second predetermined weight acts on the first biasing portion 58.

The first biasing portion 58 contracts and the second biasing portion 91A comes into contact with the base 10A so that the repulsion occurs in the second biasing portion 91A. Vibration is generated to the base 10A by the repulsion. The third biasing portion 92A disposed between the base 10A and the damper 95 absorbs the upward shock generated by the repulsion.

With reference to FIG. 4, an example of operations of the second suspension attaching portion 40 will now be described. The pressurization is previously applied to the first biasing portion 48 which is a compression spring to prevent the first biasing portion 48 from being compressed when the holding device 11 grips an empty FOUP 90. In particular, as with the first suspension attaching portion 50, the first biasing portion 48 is compressed to obtain the same repulsion as the total weight of the base 10A, the holding device 11, and the empty FOUP 90. Thus, the holding device 11 grips FOUP 90 accommodating any articles, and the load larger than the first predetermined weight acts on the first biasing portion 48 so that the first biasing portion 48 is compressed. If any relatively light articles are accommodated in the FOUP 90 (if amount of compression of the first biasing portion 48 is equal to or less than the predetermined value), the base 10A does not come into contact with an edge of the second biasing portion 91B. Therefore, the base 10A is supported by the fourth body member 46 only via the first biasing portion 48.

The load of the second predetermined weight even larger the first predetermined weight acts on the first biasing portion 48 so that the first biasing portion 48 is further compressed and the base 10A comes into contact with an edge of the second biasing portion 91B. Therefore, the base 10A is supported by the fourth body member 46 via the first biasing portion 48 and the second biasing portion 91B. Compared to being supported by the fourth body member 46 only via the first biasing portion 48, when the base 10A is supported by the body member 46 via the first biasing portion 48 and the second biasing portion 91B, the amount of sinking with respect to the same weight (amount of approaching between the base 10A and the fourth body member 46) is smaller. Therefore, coefficient of restitution of the vibration isolator 40A is changed when the load of the second predetermined weight acts on the first biasing portion 48.

The first biasing portion 48 contracts and the second biasing portion 91B comes into contact with the base 10A so that the repulsion occurs in the second biasing portion 91B. Vibration is generated to the base 10A by the repulsion. The third biasing portion 92B disposed between the base 10A and the damper 94 absorbs the upward shock generated by the repulsion.

With reference to FIGS. 5 to 7, an example of operations of the link mechanism 70 to couple between the second suspension attaching portion 40 and the first suspension attaching portion 50 that are arranged in the left-right direction will now be described. For example, a force acts on the first biasing portions 48, 48 of the second suspension attaching portion 40 arranged at left side by the centrifugal force generated during travel. The force acts on the first biasing portions 48, 48 of the second suspension attaching portion 40 so that the first biasing portions 48, 48 are compressed and the fourth body member 46 moves upward (in the direction of arrow D1). Thus, the distance between the fourth body member 46 and the base 10A are reduced. The fourth body member 46 moves upward so that one edge of the first shaft 71 (at the side of the first bush 81) fixed to the fourth body member 46 via the first bush 81 moves upward (in the direction of arrow D2) based on the other edge being coupled with the second shaft 72.

The edge of the first shaft 71 at the side of the first bush 81 moves upward so that the second shaft 72 rotates clockwise (in the direction of arrow D3). The second shaft 72 rotates clockwise so that one edge of the third shaft 73 (at the side of the coupling portion 88) coupled with the second shaft 72 moves upward (in the direction of arrow D4) based on the other edge being coupled with the second shaft 72. The second shaft 72 rotates clockwise so that one edge of the fourth shaft 74 at the side opposite to the side being coupled with the second shaft 72 moves upward (in the direction of arrow D4) based on the other edge of the fourth shaft 74 at the side being coupled with the second shaft 72. Thereby, the first body member 54 fixed to the third shaft 73 via the second bush 84 and fixed to the fourth shaft 74 via the third bush 85 is pushed upward (in the direction of arrow D5). The first body member 54 is pushed upward so that a pair of the first biasing portions 58, 58 are compressed. Thus, the distance between the first body member 54 and the base 10A is reduced.

The first biasing portions 48, 48 expand and the fourth body member 46 moves downward (in the opposite direction of arrow D1) so that one edge of the first shaft 71 (at the side of the first bush 81) moves downward (in the opposite direction of arrow D2) based on the other edge being coupled with the second shaft 72. The edge of the first shaft 71 at the side of the first bush 81 moves downward so that the second shaft 72 rotates counterclockwise (in the opposite direction of arrow D3). The second shaft 72 rotates counterclockwise so that one edge of the third shaft 73 at the side of the coupling portion 88 moves downward (in the opposite direction of arrow D4) based on the other edge being coupled with the second shaft 72 and one edge of the fourth shaft 74 at the side opposite to the side being coupled with the second shaft 72 moves downward (in the opposite direction of arrow D4) based on the other edge at the side being coupled with the second shaft 72. Thereby, the first body member 54 is pushed downward (in the opposite side of arrow D5) and the pair of the first biasing portions 58,58 expand.

In the link mechanism 70 coupling between the second suspension attaching portion 40 and the first suspension attaching portion 50 that are arranged in the left-right direction, when a spring member of one of the second suspension attaching portion 40 and the first suspension attaching portion 50 contracts or contracts, the second shaft 72, following the movement, rotates based on the first block 82 (or gear 61D) and the second block 83 fixed to bottom surface of the base 10A so that a spring member of the other of the second suspension attaching portion 40 and the first suspension attaching portion 50 expands or contracts. Therefore, when there is a difference between the distance between the base 10A and the fourth body member 46 and the distance between the base 10A and the first body member 54 in the second suspension attaching portion 40 and the first suspension attaching portion 50 coupled with each other, the link mechanism 70 operates to ensure similarity of respective distances between the base 10A and the fourth body member 46 and between the base 10A and the first body member 54 in the second suspension attaching portion 40 and the first suspension attaching portion 50 coupled with each other.

The link mechanism 70 includes the second shaft 72 in which a stress (torsional stress) occurs when there is a difference in the distance between the base 10A and the fourth body member 46 and the distance between the base 10A and the first body member 54 in the second suspension attaching portion 40 and the first suspension attaching portion 50 coupled with each other. The reaction force against the stress that occurs in the second shaft 72 serves as a force to ensure similarity of respective distances between the base 10A and the fourth body member 46 and between the base 10A and the first body member 54 in the second suspension attaching portion 40 and the first suspension attaching portion 50 coupled with each other.

An example of operations of the link mechanism 70 to couple between the first suspension attaching portions 50 arranged in the front-rear direction will now be described. For example, in the first suspension attaching portion 50 provided at the rear side, a force acts on the first biasing portions 58, 58 by acceleration or deceleration during travel. The force acts on the first biasing portions 58, 58 in the first suspension attaching portion 50 so that the first biasing portions 58, 58 are compressed and the first body member 54 moves upward (in the direction of arrow D6). Therefore, the distance between the first body member 54 and the base 10A is reduced. The first body member 54 moves upward (in the direction of arrow D5) so that one edge (at the side of the coupling portion 88) of the third shaft 73 fixed to the first body member 54 via the second bush 86 moves upward (in the direction of arrow D6) based on the other edge at the side being coupled with the second shaft 72.

The coupling portion 88 moves upward (in the direction of arrow D6) so that one edge (at the side of the coupling portion 88) of the other third shaft 73 coupled with the coupling portion 88 (the third shaft 73 arranged at the left side in FIG. 5) also moves upward (in the direction of arrow D6) based on the other edge of the third shaft 73 at the side being coupled with the second shaft 72. Thereby, the first body member 54 in the first suspension attaching portion 50 arranged at the front side and fixed to the third shaft 73 via the second bush 84 is pushed upward (in the direction of arrow D7). The first body member 54 is pushed upward so that the pair of the first biasing portions 58, 58 are compressed. Thus, the distance between the first body member 54 and the base 10A is reduced.

The first biasing portions 58, 58 in the first suspension attaching portion 50 arranged at the front side expand and the first body member 54 moves downward (in the opposite direction of arrow D5) so that one edge of the third shaft 73 at the side of the coupling portion 88 moves downward (in the opposite direction of arrow D6) based on the other edge being coupled with the second shaft 72. The coupling portion 88 moves downward so that one edge (at the side of the coupling portion 88) of the other third shaft 73 being coupled with the coupling portion 88 also moves downward (in the opposite direction of arrow D6) based on the other edge being coupled with the second shaft 72. Thereby, the first body member 54 in the first suspension attaching portion 50 arranged at the front side is pushed downward (in the opposite side of arrow D7). The first body member 54 is pushed downward so that the pair or the first biasing portions 58, 58 expand.

In the link mechanism 70 that couples between the first suspension attaching portions 50 arranged in the front-rear direction as the above, the first biasing portions 58, 58 in one first suspension attaching portion 50 compress or expand so that the movement of one third shaft 73 is followed by the movement the other third shaft 73 based on the coupling portion 88 to shrink or expand the first biasing portions 58, 58 in the other first suspension attaching portion 50. Therefore, the link mechanism 70 operates to ensure similarity of respective distances between the base 10A and the respective first body members 54, 54 in the first suspension attaching portions 50 coupled with each other.

The link mechanism 70 includes the third shaft 73 in which a stress (torsional stress) occurs when there is a difference in the respective distances between the base 10A and the respective first body members 54 in the first suspension attaching portions 50 coupled with each other. The reaction force against the stress that occurs in the third shaft 73 functions as a force to ensure similarity of respective distances between the base 10A and the first body members 54 in the first suspension attaching portions 50 coupled with each other.

Operations of the link mechanism 70 when the lock mechanism 60 is in the locked state and when the lock mechanism 60 is in the unlocked state will now be described. According to the instruction from the controller 67, the voltage is applied to the first brake 62 and the axis 61B becomes nonrotatable so that the lock mechanism 60 can be in the locked state. Thus, the axis 61B becomes nonrotatable so that the gear receiver 61C becomes nonrotatable and the gear 61D in contact with the nonrotatable gear receiver 61C also becomes nonrotatable. This locked gear 61D restricts the movement of the second shaft 72 and thus overall movements of the link mechanism 70. The restriction of movement of the link mechanism 70 leads to the restriction of movements of the first biasing portion 58 in the first suspension attaching portion 50 and the first biasing portion 48 in the second suspension attaching portion 40. Therefore, the locked state is established in which a relative positional relation between the first body member 54 (coupler 96) in the first suspension attaching portion 50 and the base 10A is fixed, and a relative positional relation between the fourth body member 46 (coupler 96) in the second suspension attaching portion 40 and the base 10A is fixed.

In contrast, application of the voltage to the first brake 62 is stopped so that the axis 61B becomes rotatable and the above locked state is released to cause the lock mechanism 60 to enter the unlocked state. The axis 61B becomes rotatable so that the gear 61D in contact with the gear receiver 61C also becomes rotatable. In this state of the gear 61D, the movement of the second shaft 72 is not restricted and the above-mentioned original movement of the link mechanism 70 comes back.

Figure 10:
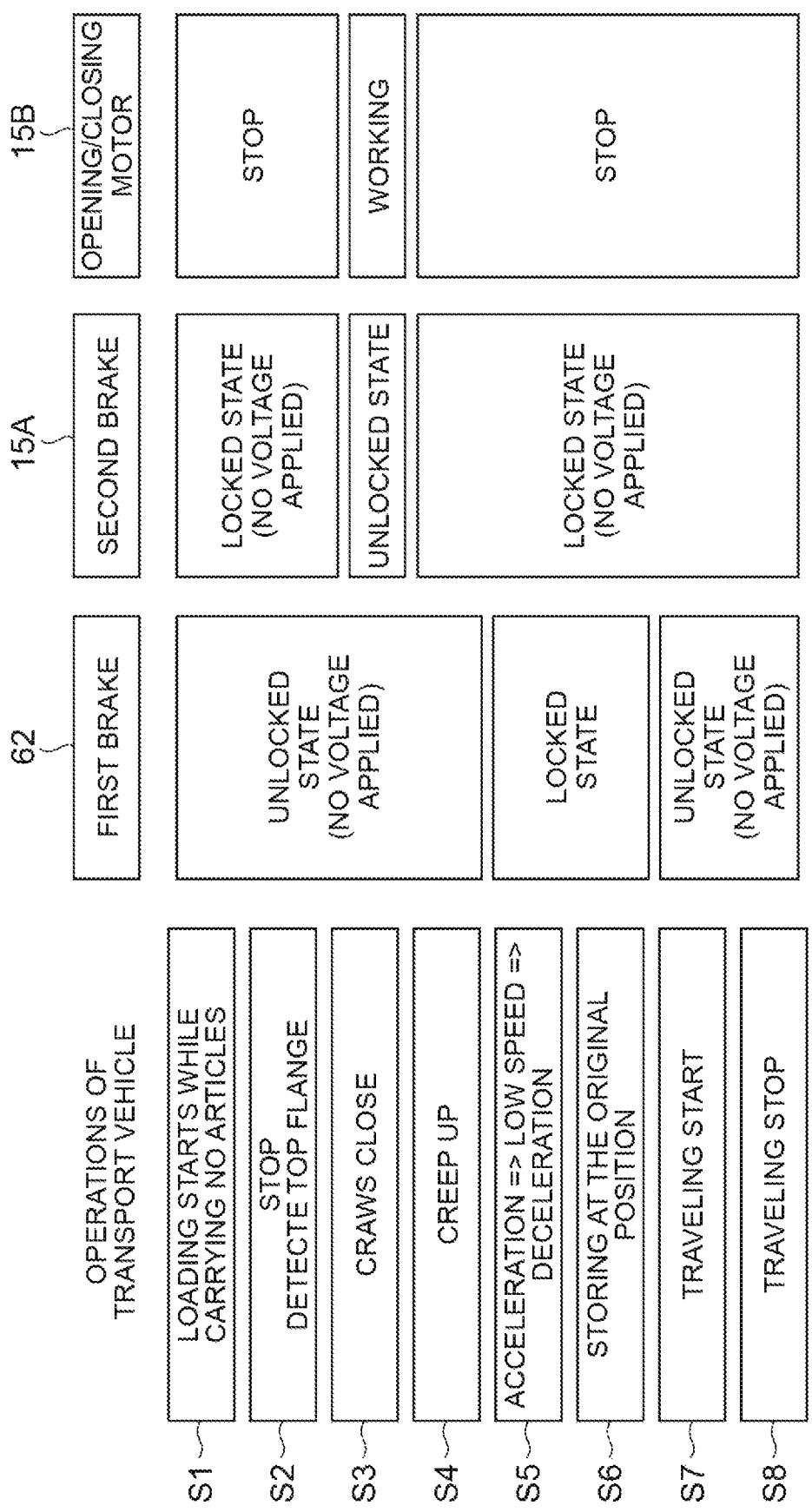
FIG. 10 is a view showing the state of a first brake, a second brake, an opening/closing motor when an article is transferred in an unladen state.

With reference to mainly FIGS. 9 to 11, an example of controlling operations of the first brake 62, the second brake 15A, and the opening/closing motor 15B by the controller 67 will now be described. First, an example of gripping FOUP 90 (gripping control), which is placed on the transfer place in an ungripped state, as shown in FIG. 10, will now be described. In the state in which the overhead transport vehicle 1 carrying no articles stays on the predetermined position of the traveling rail 2, the elevator 10 starts to descend (step S1) and then the elevator 10 stops descending when the flange 98 is detected (step 2). Then, the controller 67 of the overhead transport vehicle 1 causes the opening/closing motor 15B to operate to close the claws 13, 13 (step S3) to grip FOUP 90. The controller 67 causes the elevator 10 to ascend at the predetermined distance (creep-up) and stop ascending temporarily to check the gripping condition of FOUP 90 (step S4). After confirming that the gripping condition is without problem, the controller 67 causes the elevator 10 to restart ascending and stopping at the prescribed position (original position) of the elevator 10 during travel (step 6). These stopping operations of the elevator 10 at step S4 and step S6 may be controlled based on a signal sent from the controller 67 or based on whether the predetermined amount of the belt 90 is paid out or not. The elevator 10 is placed (stored) in its original position and then the overhead transport vehicle 1 starts to travel (step 7) and stops at the target position (destination) (step 8).

At a series of the above-mentioned steps S1 to S8, the controller 67 performs control so that the voltage is not be applied to the first brake 62 to make the lock mechanism 60 enter the unlocked state until the elevator 10 descends and creeps up (steps S1 to S4). At steps S1 to S4, the lock mechanism 60 may enter the locked state, however, there are further benefits in terms of power consumption in the unlocked state during which the voltage is not applied. From causing the elevator 10 to creep up to placing (storing) the elevator 10 in its original position (steps S5 to S6), the controller 67 performs control so that the voltage is applied to the first brake 62 and the lock mechanism 60 enter the locked state. At step S5, the controller 67 causes the lock mechanism 60 to be in the locked state. In more detail, the controller 67 controls the lock mechanism 60 to be in the locked state before the elevator 10 starts to ascend/descend, i.e., in the state in which the ascending/descending movement of the elevator 10 is inactive.

After the elevator 10 is placed (stored) on its original position, the controller 67 stops a voltage application to the first brake 62 and causes the lock mechanism 60 to be in the unlocked state. When the claws 13, 13 are closed at step S3, the controller 67 controls so that the voltage is applied to the second brake 15A and the holding device 11 enter an unlocked state, and also controls the opening/closing motor 15B. On the other hand, except when the claws 13, 13 are closed at step S3, the controller 67 performs control so that the holding device 11 enters the locked state without applying the voltage to the second brake 15A.

Next, an example of unloading FOUP 90 (unloading control), which is gripped on the transfer place in a gripped state, as shown in FIG. 11, will now be described. The unloading operations performed at steps S1 to S9 are different from the above gripping operations in that FOUP 90 is gripped at step S1, that the elevator 10 stops when the predetermined amount of paying-out is detected at step S2, that the claws are open at step S3, and that FOUP 90 is not gripped at steps S4 to S8.

At a series of the above steps S1 to S8, the controller 67 performs control so that the voltage is applied to the first brake 62 to make the lock mechanism 60 enter the locked state until the elevator 10 descends to the transfer place (steps S1 to S2). The controller 67 controls the lock mechanism 60 to enter the locked state before the elevator 10 starts to descend. After FOUP 90 is loaded on the transfer place (steps S3 to S8), the controller 67 performs control so that the lock mechanism 60 enters the unlocked state without applying the voltage to the first brake 62. When the claws 13, 13 are closed at step S3, the controller 67 performs control so that the voltage is applied to the second brake 15A and the holding device 11 enters the unlocked state and also controls the opening/closing motor 15B. On the other hand, except when the claws 13, 13 are closed at step S3, the controller 67 performs control so that the holding device 11 is in the locked state without applying the voltage to the second brake 15A.

The operational effect of the overhead transport vehicle 1 according to the above preferred example will now be described. In the overhead transport vehicle 1 according to the above preferred example, the vibration isolator 50A and the vibration isolator 40 are provided between the first suspension attaching portion 50 and the base 10A and between the second suspension attaching portion 40 and the base 10A, respectively. Thereby, vibration generated during travel is absorbed by the vibration isolator 50A and the vibration isolator 40A, and is not easily transmitted to FOUP 90. In addition, the lock mechanism 60 becomes in the locked state at least partially during elevating operation of the elevator 10 so that vibration generated by the vibration isolator 50A and the vibration isolator 40A is reduced, allowing for an easy positioning of FOUP 90 to be transferred. As a result, FOUP 90 to be transferred is easily positioned and vibration transmitted to FOUP 90 during travel is reduced.

In the above preferred example, the lock mechanism 60 include the gear 61D, which is provided at the base 10A and capable of moving according to the distance between the suspension attaching portion 50 and the base 10A and the distance between the suspension attaching portion 40 and the base 10A, and the first brake 62 that switches the gear 61D between a movable state and an immovable state. The first brake 62 causes the gear mechanism 61 to be in an immovable state, which causes the lock mechanism 60 to be in the locked state and the gear mechanism 61 to be in a movable state, which causes the lock mechanism 60 to be in the unlocked state. With this configuration, an absorbing operation of vibration caused during travel, which is performed by the first biasing portions 48, 58, is partially restricted and the restriction is released so that the lock mechanism 60 can be switched between the locked state and the unlocked state. Therefore, the lock mechanism 60 can be simply configured.

In addition, the configuration of the lock mechanism 60 according to the above preferred example allows switching operation between locked and unlocked to be easier than the configuration (compared configuration) that establishes the locked state, for example, by bringing a part of a supporter (a member corresponding to the fourth body member 46 or the coupler 96) into contact with a part of the base 10A and that establishes the unlocked state by causing a part provided at a supporter to break contact with a part of the base 10A. In other words, in the above preferred example that stops the fluctuation in distance between the first suspension attaching portion 50 and the base 10A or in distance between the second suspension attaching portion 40 and the base 10A in its movement, no preliminary operation is performed and there are multiple advantages compared to the another configuration that locks the above distances by performing the preliminary operation to prevent any fluctuation in the above distances. For example, vibration caused by the preliminary operation can be prevented or the switching operation between locked and unlocked can be quickly performed. Accordingly, timing of the switch between locked and unlocked is flexible is flexible so that there is an advantage that the above switching operation can be performed at the desired time.

In the above preferred example, a braking mechanism is employed as the first brake 62 that establishes an immovable state when voltage is applied and a movable state when no voltage is applied. Another braking mechanism is further employed as the second brake 15A that locks an opening/closing of the claws 13, 13 when no voltage is applied and that releases the locked claws 13, 13 when voltage is applied. With this configuration, as shown in FIGS. 10 and 11, the voltage is not applied to both of the first brake 62 and the second brake 15A at the same time during a series of the above gripping control and loading control. As a result, power consumption can be suppressed.

In the above preferred example, the link mechanism 70 is provided to ensure similarity of respective distances between the base 10A and the first suspension attaching portion 50 and between the base 10A and the second suspension attaching portion 40 coupled with the first suspension attaching portion 50. This can suppress a rolling operation of the elevator 10 during travel. In more detail, the link mechanism 70 couples between the first suspension attaching portion 50 and the second suspension attaching portion 40 that are arranged in the left-right direction (width direction) perpendicular to both of the front-rear direction and up-down direction in which the traveling drive unit 3 travels so that a roll motion in the width direction caused by curve-traveling or transferring FOUP 90 in the lateral direction can be suppressed. Further, the link mechanism 70 couples between two of the first suspension attaching portions 50 arranged in the direction in which the traveling drive unit 3 travels so that a roll motion in the front-rear direction caused by acceleration or deceleration during travel, can be suppressed.

The controller 67 controls so that the lock mechanism 60 may be locked while the elevating operation of the elevator 10 is inactive. Therefore, vibrations caused by a locking operation performed by the lock mechanism 60 can be reduced.

The controller 67 controls so that the lock mechanism may be in the locked state after FOUP 90 is lifted from the transfer place at a predetermined distance (step S4). In the overhead transport vehicle 1 including the above-described first biasing portions 48, 58, the behavior (temporary compression and expand) occurs at the first biasing portions 48, 58 to absorb vibration generated when FOUP 90 is lifted from the transfer place. When the lock mechanism 60 is locked in the way of the behavior, the behavior is restarted after the lock is released. This configuration enables a state in which the behavior of the first biasing portions 48, 58 converges, that is, a state in which the lock mechanism 60 is locked when the first biasing portions 48, 58 are counterpoised. Therefore, FOUP 90 does not move up/down when the lock mechanism is unlocked. This can reduce vibration generated by unlocking.

The controller 67 controls the first brake 62 so that the lock mechanism 60 may be locked before the elevator 10 starts to descend. Thereby, vibration generated by the elevating operation of the elevator 10 can be more surely reduced.

As the above, a preferred example was described, however, our vehicles are not limited to the above preferred example. Any changes can be made without departing from the scope of this disclosure.

The link mechanism 70 may couple between two of the first suspension attaching portion 50 and the second suspension attaching portion 40 arranged in the left-right direction and also couple between the first suspension attaching portions 50 arranged in the front-rear direction. However, the link mechanism 70 need not be provided in the overhead transport vehicle 1. With this configuration, for example, the above lock mechanism 60 corresponding to each of the first suspension attaching portion 50 and the second suspension attaching portion 40 may be provided to cause an edge of the gear 61D to come into contact with each of the fourth body member 46 and the coupler 96. Also in this configuration, the lock mechanism 60 is locked so that the distance between the first body member 54 (coupler 96) in the first suspension attaching portion 50 and the base 10A and the distance between the fourth body member 46 in the second suspension attaching portion 40 and the base 10A can be fixed.

The first suspension attaching portion 50 may be provided at the right side of the elevator 10 in the left-right direction and the second suspension attaching portion 40 is provided at the left side of the elevator 10 in the left-right direction, but is not limited to this configuration. For example, the positions of the first suspension attaching portion 50 and the second suspension attaching portion 40 in the left-right direction may be switched. Further, the first suspension attaching portions 50 or the second suspension attaching portions 40 may be provided at the both sides in the left-right direction.

Instead of or in addition to the first biasing portion 58 or the first biasing portion 48 according to the above preferred example and the other configuration, for example, a gel-like elastic body made of a silicone resin may be provided. In a similar manner to when the first biasing portion 58 or the first biasing portion 48 is provided, vibration or shock can be absorbed.

In the above preferred example or other configuration, the controller 67 that controls the rock mechanism 60 is provided at the body unit 4. For example, in addition to the controller that controls the entire overhead transport vehicle 1, another controller may be provided at the elevator 10. In the above preferred example or other configuration, the stopping of the elevator 10 at the original position is controlled by the signal sent from the controller 67, but may also be controlled by a sensor provided at the elevator 10 to detect the original position.

The invention claimed is:

1. An overhead transport vehicle comprising:
   a body unit capable of traveling along a rail; and
   an elevator comprising a gripper configured to grip an article and to ascend and descend with respect to the body unit by a plurality of suspension members, wherein the elevator comprises:
   a base to which the gripper is attached,
   a plurality of suspension attaching portions to which the plurality of suspension members are each attached, when the plurality of suspension attaching portions are each configured to support the base to be vertically movable from below in a vertical direction via a vibration isolator,
   a lock mechanism configured to fix a relative positional relation between each of the plurality of suspension attaching portions and the base, and
   a controller configured to control the lock mechanism to be in 1) a locked state to fix the relative positional relation at least partially during elevating operation of the elevator, and 2) an unlocked state by releasing the locked state at least partially during traveling operation of the body unit.

2. The overhead transport vehicle according to claim 1, wherein
   the lock mechanism is provided at the base and includes an interlocker capable of moving in accordance with a distance between the suspension attaching portion and the base, and a switch configured to switch the interlocker between a movable state and an immovable state, and
   the switch causes the lock mechanism to enter the locked state by switching the interlocker to the immovable state and causes the lock mechanism to enter the unlocked state by switching the interlocker to the movable state.

3. The overhead transport vehicle according to claim 2, wherein
the switch is a braking mechanism configured to cause the interlocker to enter the immovable state when voltage is applied and enter the movable state when no voltage is applied, and
the gripper further comprises:
claws configured to grip the article by being closed and to release the gripped article by being opened;
a driving unit that opens or closes the claws; and
a braking mechanism configured to lock opening and closing of the claws when no voltage is applied and release the locked claws when voltage is applied.

4. The overhead transport vehicle according to claim 1, wherein
the plurality of the suspension attaching portions are coupled to each other by a link mechanism,
the link mechanism operates to ensure similarity of respective distances between each of the suspension attaching portions coupled with each other and the base, and
the operation of the link mechanism is restricted so that the lock mechanism enters the locked state.

5. The overhead transport vehicle according to claim 1, wherein the controller is configured to control the lock mechanism to operate to enter the locked state while the elevating operation of the elevator is inactive.

6. The overhead transport vehicle according to claim 1, wherein the controller is configured to control the lock mechanism to operate to enter the locked state after the article is lifted from the transfer place at a predetermined distance.

7. The overhead transport vehicle according to claim 1, wherein the controller is configured to control the lock mechanism to operate to enter the locked state before the elevator starts to descend.

8. The overhead transport vehicle according to claim 2, wherein
the plurality of the suspension attaching portions are coupled to each other by a link mechanism,
the link mechanism operates to ensure similarity of respective distances between each of the suspension attaching portions coupled with each other and the base, and
the operation of the link mechanism is restricted so that the lock mechanism enters the locked state.

9. The overhead transport vehicle according to claim 3, wherein
the plurality of the suspension attaching portions are coupled to each other by a link mechanism,
the link mechanism operates to ensure similarity of respective distances between each of the suspension attaching portions coupled with each other and the base, and
the operation of the link mechanism is restricted so that the lock mechanism enters the locked state.

10. The overhead transport vehicle according to claim 2, wherein the controller is configured to control the lock mechanism to operate to enter the locked state while the elevating operation of the elevator is inactive.

11. The overhead transport vehicle according to claim 3, wherein the controller is configured to control the lock mechanism to operate to enter the locked state while the elevating operation of the elevator is inactive.

12. The overhead transport vehicle according to claim 4, wherein the controller is configured to control the lock mechanism to operate to enter the locked state while the elevating operation of the elevator is inactive.

13. The overhead transport vehicle according to claim 2, wherein the controller is configured to control the lock mechanism to operate to enter the locked state after the article is lifted from the transfer place at a predetermined distance.

14. The overhead transport vehicle according to claim 3, wherein the controller is configured to control the lock mechanism to operate to enter the locked state after the article is lifted from the transfer place at a predetermined distance.

15. The overhead transport vehicle according to claim 4, wherein the controller is configured to control the lock mechanism to operate to enter the locked state after the article is lifted from the transfer place at a predetermined distance.

16. The overhead transport vehicle according to claim 4, wherein the controller is configured to control the lock mechanism to operate to enter the locked state after the article is lifted from the transfer place at a predetermined distance.

17. The overhead transport vehicle according to claim 2, wherein the controller is configured to control the lock mechanism to operate to enter the locked state before the elevator starts to descend.

18. The overhead transport vehicle according to claim 3, wherein the controller is configured to control the lock mechanism to operate to enter the locked state before the elevator starts to descend.

19. The overhead transport vehicle according to claim 4, wherein the controller is configured to control the lock mechanism to operate to enter the locked state before the elevator starts to descend.

20. The overhead transport vehicle according to claim 5, wherein the controller is configured to control the lock mechanism to operate to enter the locked state before the elevator starts to descend.

21. The overhead transport vehicle according to claim 5, wherein the controller is configured to control the lock mechanism to operate to enter the locked state before the elevator starts to descend.

* * * * *